United States Patent
Lee

(12) 
(10) Patent No.: US 6,495,920 B2
(45) Date of Patent: Dec. 17, 2002

(54) WIRING FOR SEMICONDUCTOR DEVICE

(75) Inventor: Chang Jae Lee, Chungcheongbuk-do (KR)

(73) Assignee: Hyundai Electronics Industries, Co., Ltd., Kyoungki-do (KR)

(*) Notice: Subject to any disclaimer, the term of this patent is extended or adjusted under 35 U.S.C. 154(b) by 0 days.

(21) Appl. No.: 09/883,988

(22) Filed: Jun. 20, 2001

(65) Prior Publication Data

US 2001/0030334 A1 Oct. 18, 2001

Related U.S. Application Data

(62) Division of application No. 08/924,534, filed on Sep. 5, 1997.

(30) Foreign Application Priority Data

Sep. 7, 1996 (KR) ........................................ 38789/1996

(51) Int. Cl.⁷ .................. H01L 23/48; H01L 23/52; H01L 29/40
(52) U.S. Cl. .................. 257/768; 257/377; 257/385; 438/652
(58) Field of Search .................. 257/296, 288, 257/344, 377, 385, 408, 774, 768, 365, 770; 438/652, 688, 279

(56) References Cited

U.S. PATENT DOCUMENTS

| | | |
|---|---|---|
| 4,074,304 A | 2/1978 | Shiba |
| 4,305,760 A | 12/1981 | Trudel |
| 4,477,962 A | 10/1984 | Godejahn, Jr. |
| 4,675,073 A | 6/1987 | Douglas |
| 4,676,866 A | 6/1987 | Tang |
| 4,757,032 A | 7/1988 | Contiero |
| 4,822,754 A | 4/1989 | Lynch et al. |
| 4,957,590 A * | 9/1990 | Douglas ................ 156/643 |
| 4,992,389 A | 2/1991 | Ogura et al. |
| 5,010,032 A * | 4/1991 | Tang et al. ................ 438/57 |
| 5,012,309 A | 4/1991 | Nakayama |
| 5,014,103 A | 5/1991 | Ema |
| 5,091,761 A | 2/1992 | Hiraiwa et al. |
| 5,122,225 A * | 6/1992 | Douglas ................ 156/643 |
| 5,140,389 A | 8/1992 | Kimura et al. |
| 5,190,893 A * | 3/1993 | Jones, Jr. et al. ........... 438/192 |
| 5,270,238 A * | 12/1993 | Kim ................ 438/52 |
| 5,389,570 A | 2/1995 | Shiozawa |
| 5,414,302 A * | 5/1995 | Shin et al. ................ 257/752 |
| 5,457,065 A * | 10/1995 | Huang et al. ................ 438/60 |
| 5,480,837 A | 1/1996 | Liaw et al. |

(List continued on next page.)

OTHER PUBLICATIONS

Shibahara et al., "IGDRAM Cell With Diagonal Bit–Line (DBL) Configuration and Edge Operation MOS (EOS) FET," IEDM 1994, pp. 639–642.

Gocho et al., "Trench Isolation Technology for 0.35 um Device by Bias ECR CVD," pp. 87–88.

*Primary Examiner*—David Nelms
*Assistant Examiner*—Andy Huynh
(74) *Attorney, Agent, or Firm*—Birch, Stewart, Kolasch & Birch, LLP

(57) ABSTRACT

Wiring for a semiconductor device which is suitable for high density device packing, and a method for forming the same, are disclosed. The wiring includes: impurity regions formed in a substrate on both sides of an insulated gate electrode; a first conduction layer formed on the impurity regions; and a second conduction layer formed in contact with the first conduction layer on one side of the gate electrode. The method includes the steps of: forming impurity regions in a substrate on both sides of an insulated gate electrode; forming a first conduction layer on the impurity regions; and forming a second conduction layer in contact on one side of the gate electrode with the first conduction layer.

19 Claims, 13 Drawing Sheets

U.S. PATENT DOCUMENTS

| | | |
|---|---|---|
| 5,563,088 A | 10/1996 | Tseng |
| 5,567,651 A | 10/1996 | Berti et al. |
| 5,569,948 A * | 10/1996 | Kim .......................... 257/296 |
| 5,595,928 A * | 1/1997 | Lu et al. ...................... 438/52 |
| 5,608,266 A | 3/1997 | Angello et al. |
| 5,639,678 A | 6/1997 | Lee et al. |
| 5,643,819 A * | 7/1997 | Tseng .......................... 438/60 |
| 5,665,646 A | 9/1997 | Kitano |
| 5,668,051 A | 9/1997 | Chen et al. |
| 5,683,924 A * | 11/1997 | Chan et al. ................... 438/44 |
| 5,688,713 A * | 11/1997 | Linliu et al. .................. 438/60 |
| 5,717,254 A * | 2/1998 | Hashimoto .................. 257/288 |
| 5,731,239 A | 3/1998 | Wong et al. |
| 5,733,816 A | 3/1998 | Iyer et al. |
| 5,807,770 A | 9/1998 | Mineji |
| 5,849,634 A | 12/1998 | Iwata |
| 6,001,697 A | 12/1999 | Chang et al. |

* cited by examiner

WIRING FOR SEMICONDUCTOR DEVICE

This is a division of application Ser. No. 08/924,534, filed Sep. 5, 1997.

FIELD OF THE INVENTION

The present invention relates to wiring for a semiconductor device, and more particularly to wiring for a semiconductor device which is suitable for high density device packing, and a method for forming the same.

BACKGROUND OF THE INVENTION

In general, a conventional electrical connection wiring for a contact in a semiconductor device is produced by: forming an insulating film of a CVD oxide on a substrate having a semiconductor device formed thereon; forming holes in source/drain impurity regions; forming a titanium layer thereon for lowering contact resistance to the source/drain impurity regions; forming a TiN or Ti/W film as a diffusion prevention film; and forming an aluminum layer for electrical interconnection between cells. However, as semiconductor device packing advances, the size of chip has been reduced with consequential reductions in contact hole size. This has worsened the step coverage problems associated with the contact hole because the aspect ratio has increased as the hole has become smaller. An improved method for forming device wiring is needed.

Conventional wiring and a method for forming the wiring will be explained with reference to the attached drawings.

FIG. 1 illustrates conventional wiring for a semiconductor device, and FIGS. 2a–2d are cross-sections showing the steps of a conventional method for forming the wiring.

Referring to FIG. 1, the conventional wiring includes: a field oxide film 2 formed on a first conductive type semiconductor substrate (a P-type semiconductor substrate) 1; a gate electrode 4 formed on the P-type semiconductor substrate 1 insulated from surroundings; source/drain regions 8 of LDD structures formed on the substrate on both sides of the gate electrode 4; a CVD oxide film 9 and a planar protection film 10 in contact with a source/drain region 8; a TiN layer 12 formed on a titanium layer 11; an aluminum layer 13 formed on the TiN layer 12; and a silicide region 11a formed under a portion of the titanium layer 11 in contact with the source/drain regions 8 on one side of the gate electrode 4.

FIGS. 2a–2d illustrate sections showing the steps of a conventional method for forming the wiring.

Referring to FIG. 2a, a first pad oxide film and a nitride film are deposited in succession on a P-type semiconductor substrate 1 and a photoresist film is coated thereon and subjected to exposure and development for selective patterning. Using the patterned photoresist film as a mask, the nitride film and the oxide film are removed in succession (not shown). A field oxide film 2 is formed by thermal oxidation, and the photoresist film is removed. By way of thermal oxidation or chemical vapor deposition (CVD), an oxide film is deposited on the exposed surfaces and a silicon oxide film is deposited on the first polysilicon layer by a chemical vapor deposition. A photoresist film is coated thereon and subjected to exposure and development so as to pattern the photoresist and leave only a portion at which a gate electrode 4 is to be formed. Using the patterned photoresist film as a mask, the silicon oxide film and the first polysilicon layer are subjected to anisotropic etching successively to form a gate electrode 4 and a gate cap oxide film 5.

After the gate electrode 4 and the gate cap 5 have been formed, phosphorus ions are injected into the P-type semiconductor substrate 1 on both sides of the gate electrode 4 at an ion injection energy of 30 KeV and dosage of abut $2.3 \times 10^{13}$ atoms/cm$^2$ to form lightly doped source/drain regions 6. By way of thermal oxidation or chemical vapor deposition, a silicon oxide film is deposited and anisotropically etched to form sidewall oxide films 7 at sides of the gate electrode 4 and the gate cap oxide film 5. Then, arsenic ions are injected into the P-type semiconductor substrate 1 aside the sidewall oxide films at an ion injection energy of 7 at 40 KeV and dosage of about $4.0 \times 10^{15}$ atoms/cm$^2$ to form highly doped source/drain regions 8.

Referring to FIG. 2b, the gate oxide film 3 on one side of the gate electrode 4 is removed. An undoped thin chemical vapor deposition oxide film 9 is formed on the exposed surfaces to a thickness of 1000 Å and a planar protection film (BPSG) 10 is formed on the film 9 to a thickness of 5000 Å and heat treated at an elevated temperature of 800–900° C. to make the surface planar. A photoresist film is coated and subjected to photolithography and development to pattern the photoresist film selectively.

Referring to FIG. 2c, the exposed planar protection film 10 and the undoped CVD oxide film 9 are removed by reactive ion etching to expose the source/drain impurity regions 8, after which the photoresist film is removed.

Referring to FIG. 2d, a titanium layer 11 of about 1000 Å in thickness is sputtered on the entire surface for lowering the contact resistance, a TiN layer 12 of about 500 Å in thickness is sputtered thereon to serve as a buffer for the titanium layer and aluminum, and an aluminum layer 13 of the about 7000 Å in thickness is also sputtered thereon. A photoresist film is coated and subjected to photolithography and development so as to pattern the photoresist film selectively, i.e., only leave a portion under which wiring is to be formed. Using the pattered photoresist film as a mask, the exposed aluminum layer 13 and TiN layer 13 are removed in succession, and subjected to heat treatment for lowering resistance of the wiring, which results in formation of a silicide 11a under the titanium layer 11 in contact with the source/drain impurity region 8.

The aforementioned wiring for a semiconductor device has the following problems.

First, the formation of the titanium layer, TiN layer and aluminum layer by sputtering (which produces high velocity ions of random direction) causes inferior step-coverage in the contact hole and, therefore, low reliability of the wiring.

Second, the etching of the thick insulating film on the semiconductor substrate at a shallow junction for formation of the contact hole may damage the semiconductor substrate including the source/drain regions.

Third, the implantation of etching gas into the semiconductor substrate during the formation of the contact hole increases a contact resistance between the semiconductor substrate and the wiring.

Fourth, as device packing density increases, the aspect ratio of the contact hole increases and the alignment tolerance between the gate structure and the contact hole for the bit line decreases (due to a size reduction in, and greater step of, the contact hole) which increases misalignment between the contact hole and the wiring making the wiring susceptible to a short with the gate electrode or the semiconductor substrate.

SUMMARY OF THE INVENTION

Accordingly, the present invention is directed to wiring for a semiconductor device and a method for forming the same that substantially obviates one or more of the problems due to limitations and advantages of the related art.

These and other advantages in accordance with the purposes of the present invention are achieved by providing wiring for a semiconductor device that includes: impurity regions formed in a substrate on both sides of an insulated gate electrode; a first conductive layer formed on each of the impurity regions; and a second conductive layer in contact on one side of the gate electrode with the first conductive layer.

In another aspect of the present invention, a method is provided for forming wiring for a semiconductor device that includes the steps of: forming impurity regions in a substrate on both sides of an insulated gate electrode; and forming a second conductive layer in contact on one side of the electrode with the first conductive layer.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention (but do not limit the invention) and together with the description serve to explain the principles of the invention.

In drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
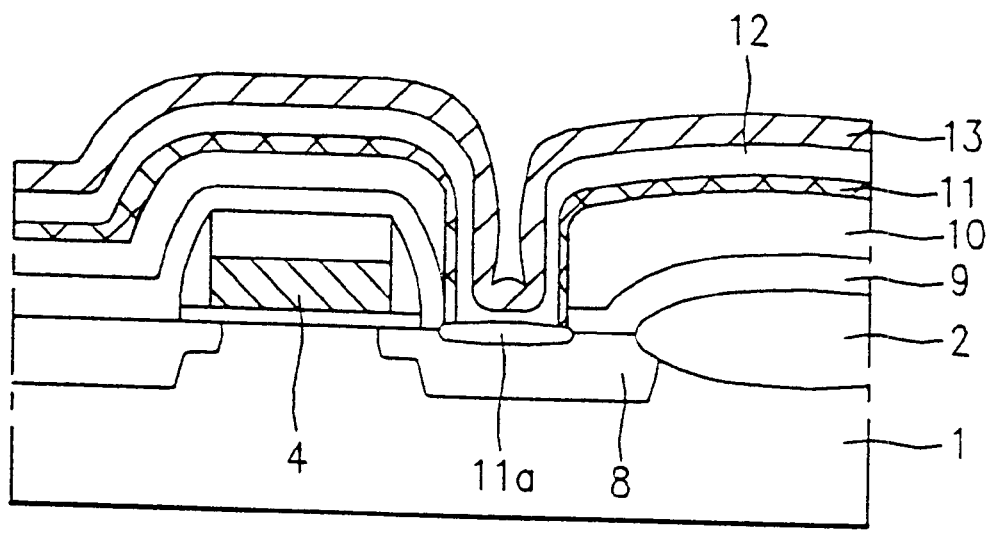
FIG. 1 illustrates a conventional wiring for a semiconductor device.
Figure 2A:
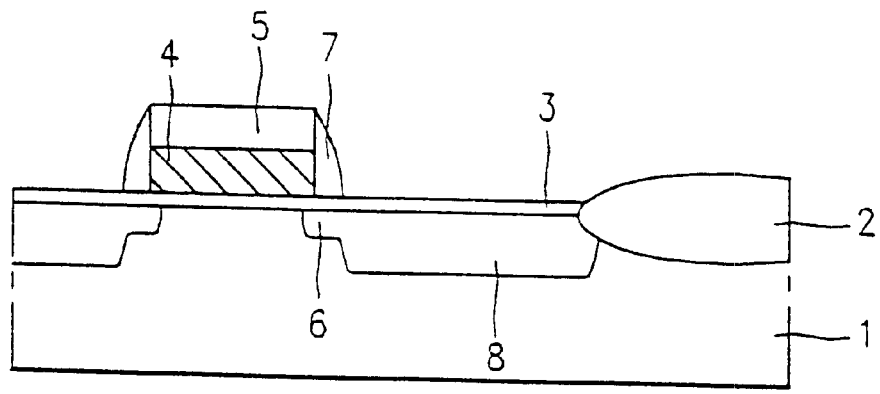
FIGS. 2a–2d are cross-sections showing the steps of a conventional method for forming a wiring.
Figure 2B:
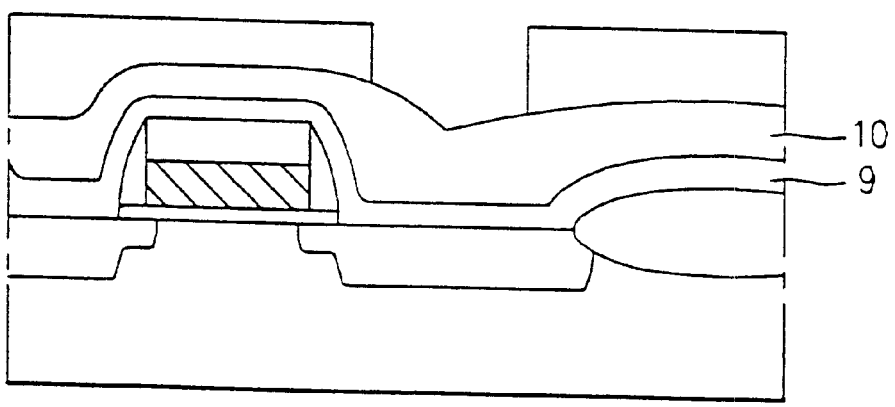
Figure 2C:
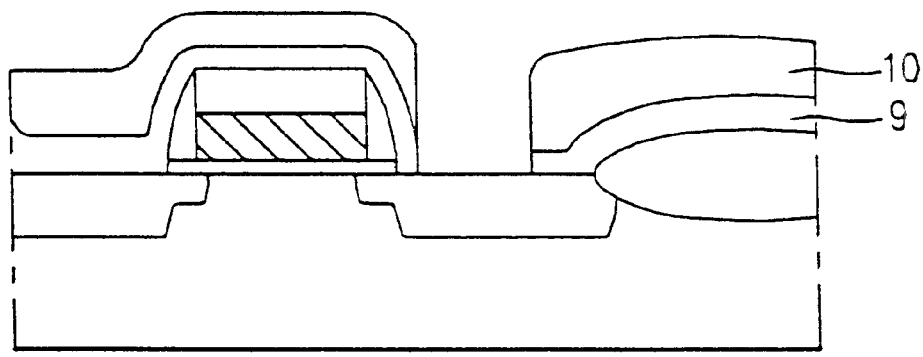
Figure 2D:
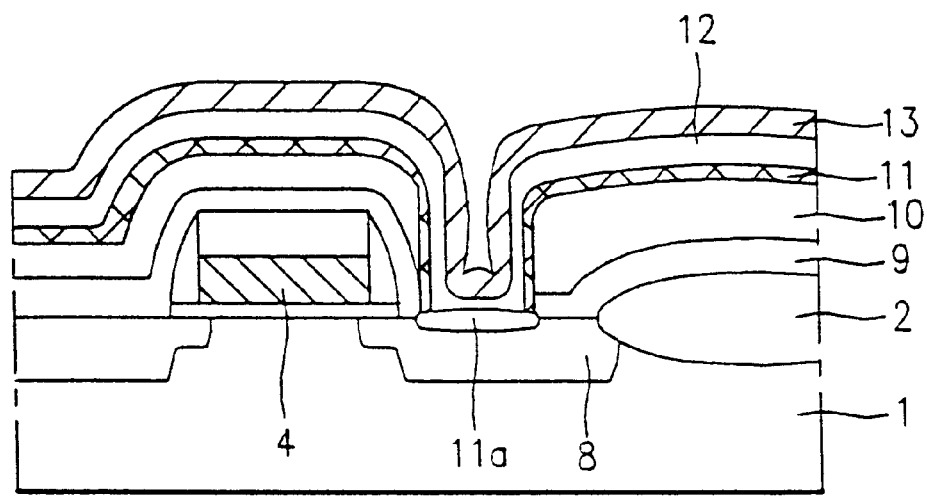
Figure 3:
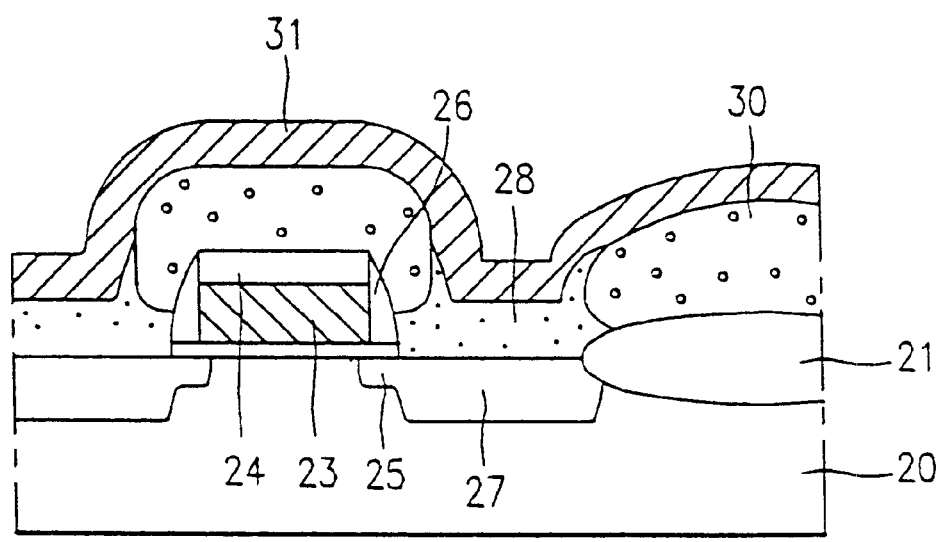
FIG. 3 is a cross section depicting wiring for a semiconductor device in accordance with a first embodiment of the present invention.

FIG. 3 is a cross section depicting wiring for a semiconductor device in accordance with a first embodiment of the present invention.

Referring to FIG. 3, the wiring for the semiconductor device of the first embodiment includes: a field oxide film 21 formed in a predetermined region of a doped semiconductor, e.g., P-type silicon, substrate 20; a gate insulator, e.g., oxide, film 22; a gate electrode 23 formed at a predetermined portion in an active region insulated by the field oxide film 21; a gate cap insulating film 24 formed on the gate electrode 23; sidewall spacers, e.g., oxide films, 26 formed against both sides of the gate electrode 23; LDD-structured source/drain regions 25 formed in the P-type semiconductor substrate on both sides of the gate electrode 23; heavily doped source/drain regions 27 in the substrate 20 adjacent to the LDD regions 25; a conductive layer, e.g., doped polysilicon, 28 formed on the source/drain region on one side of the gate electrode 23; an insulator, e.g., an oxide, film 30 formed on the gate structure and field region but not over the polysilicon layer 28; and a conductive layer, e.g., a metal such as aluminum, 31 formed in contact with the polysilicon layer 28 over the source/drain region on one side of the gate electrode 23.

FIGS. 4a–4d depict cross sections illustrating steps of a method for forming wiring in accordance with FIG. 3.

Figure 4A:
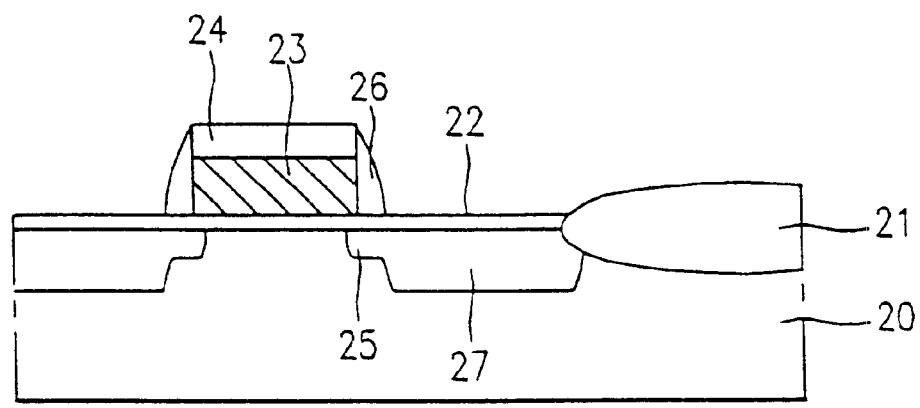
FIGS. 4a–4d are cross sections depicting the steps of a method for forming wiring in accordance with FIG. 3.

Referring to FIG. 4a, insulators, e.g., a pad oxide film and a nitride film (not shown), are deposited on the P-type, semiconductor, e.g., Si, substrate to succession, and a photoresist film (not shown) is coated on the nitride film and subjected to exposure and development to selectively pattern the photoresist film. Using the patterned photoresist film, the nitride film and the oxide film are removed in succession (again, not shown in the drawing). A field oxide film 21 is formed by the thermal oxidation and the photoresist film is removed. An oxide film is formed on the exposed surface of the substrate by, e.g., thermal oxidation or chemical vapor deposition, as the basis for a later-completed gate oxide film 22.

Continuing the discussion of FIG. 4a., the doped polysilicon, layer is formed, e.g., by CVD, on the exposed surfaces and an oxide film is formed thereon, e.g., by CVD. The doped polysilicon layer alternatively may be replaced with a doped amorphous silicon layer. A photoresist film is coated on the exposed surfaces and patterned selectively by exposure and development. Using the patterned photoresist film as a mask, the film and the polysilicon layer are subjected to, e.g., anisotropic etching, in succession to form the gate electrode 23 and a gate cap oxide film 24.

After the gate electrode 23 and the gate cap 24 have been formed, N-type ions, e.g., phosphorous, are injected into the P-type semiconductor substrate 20 on both sides of the gate electrode 23 at a dosage of about $2.3 \times 10^{13}$ atoms.cm$^2$ and an ion implantation energy of about 30 KeV, to form lightly doped source/drain LDD regions 25. Alternatively, if the semiconductor substrate is N type, then P-type ions, e.g., boron, are injected to form the LDD regions 25. An oxide film, e.g., silicon oxide, is formed on the exposed surfaces, e.g., by thermal oxidation or chemical vapor deposition, and selectively removed, e.g., by anisotropic etching such as reactive ion etching, to form sidewall spacers 26 against the sides of the gate electrode 23 and the gate cap oxide film 24. N-type ions, e.g., arsenic, are injected into the P-type semiconductor substrate 20 on both sides of the sidewall spacers 26 at a dosage of about $6.0 \times 10^{15}$ atoms/cm$^2$ and an ion implementation energy of about 50 KeV, to form the heavily doped source/drain regions 27.

Figure 4B:
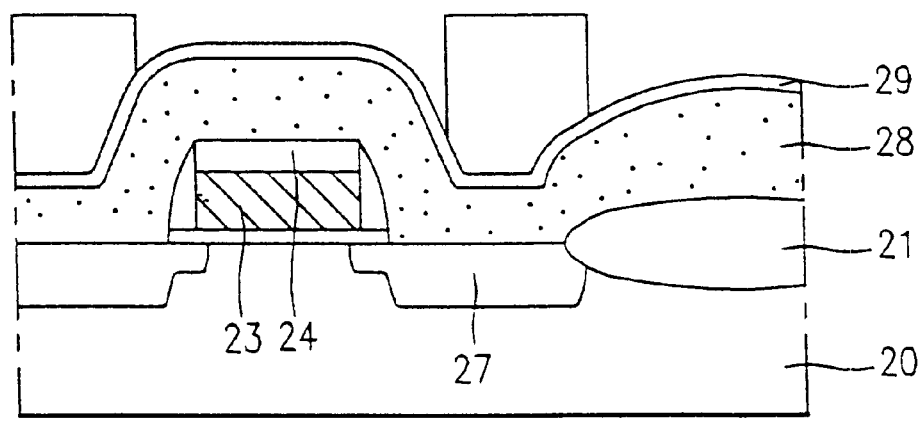

Referring to FIG. 4b, after removing the gate oxide film 22 where it extends beyond the gate structure, an N-type conductive layer 28, e.g., a phosphorus or arsenic doped polysilicon or amorphous silicon layer, is formed on the exposed surfaces and an insulating layer, e.g., silicon nitride, film 29, is formed thereon, e.g., by low pressure chemical vapor deposition, respectively (LPCVD). Alternatively, if the semiconductor substrate is of N-type conductivity, a P-type doped layer 28, boron-doped polysilicon or amorphous silicon, is used. A photoresist film is coated on the exposed surfaces and subjected to exposure and development to pattern the photoresist film so as to leave the photoresist film only on portions of the nitride film located over the source/drain region 27.

Figure 4C:
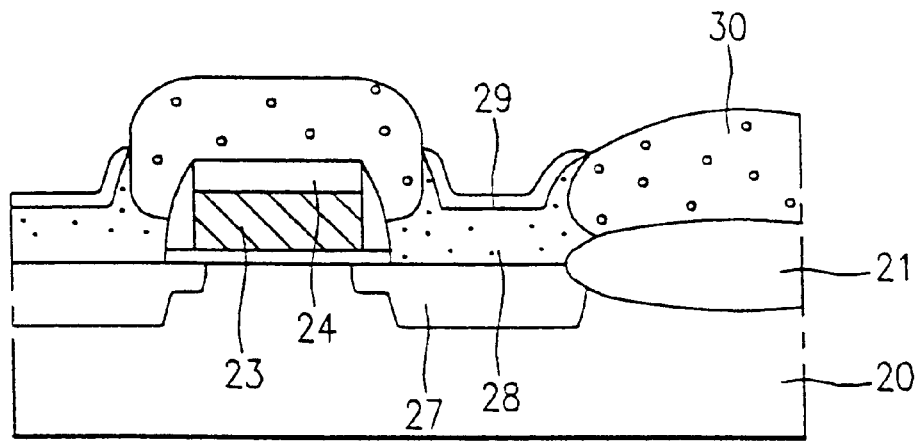

Referring to FIG. 4c, using the patterned photoresist film as a mask, the exposed silicon nitride film 29 is subject to, e.g., reactive ion etching for anisotropic removal of the same. After removal of the remaining photoresist film, the exposed polysilicon layer 28 is, e.g., subjected to an elevated temperature of about 800° C. in an electric diffusion furnace in an $H_2/O_2$ environment to oxidize the exposed polysilicon layer 28 into a polysilicon oxide film 30.

Figure 4D:
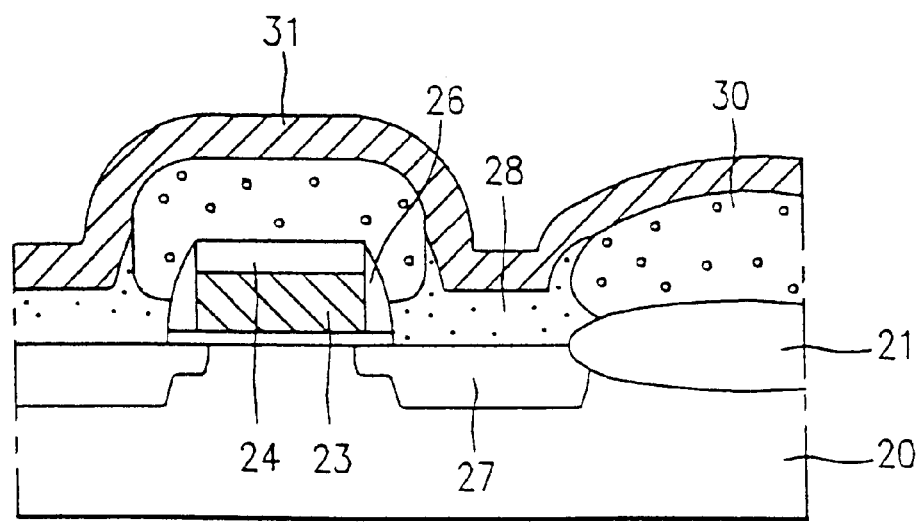

Referring to FIG. 4d, the remaining silicon nitride film 29 is removed completely, e.g., by dipping it into hot phosphoric acid. Then a conductor, e.g., a metal such as aluminum, 31 is deposited on entire surface to complete the wiring.

Figure 5:
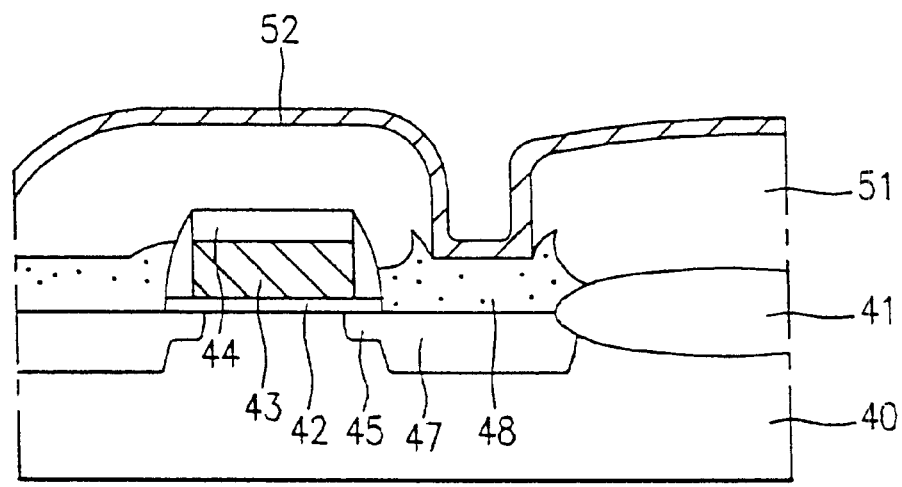
FIG. 5 is a cross section depicting wiring for a semiconductor device in accordance with a second embodiment of the present invention.

FIG. 5 illustrates cross section of wiring for a semiconductor device in accordance with a second embodiment of the present invention.

Referring to FIG. 5, the wiring for a semiconductor device of the second embodiment includes: a field oxide film 41 formed in a predetermined region of a doped semiconductor, e.g., P-type Si, substrate 40; a gate insulator, e.g., oxide, film 42 and a gate electrode 43 formed on a predetermined portion of an active region insulated by the field oxide film 41; a gate cap insulator, e.g., oxide, film 44 formed on the gate electrode 43; sidewall spacers, e.g., oxide films, 46 formed against both sides of the gate electrode 43; LDD-structured source/drain regions 45 formed in the P-type semiconductor or substrate 40 on both sides of the gate electrode 43; heavily doped-sourced/drain regions 47 formed in the substrate 40 to the sides of the sidewall spacers 46; a conductive layer 48, e.g., polysilicon, formed on the source/drain region on one side of the gate electrode 43; an insulator 51, e.g., a chemical vapor deposition oxide film, formed everywhere on gate structure, the conductive layer 48 and the field oxide film 41 except over the source/drain regions 48; and a conductive layer 52, e.g., a metal such as aluminum, formed into contact with the polysilicon layer 48 over the source/drain region 48 on one side of the gate electrode 43.

FIGS. 6a–6e are cross-sections illustrating the steps of a method for forming wiring in accordance with FIG. 5.

Figure 6A:
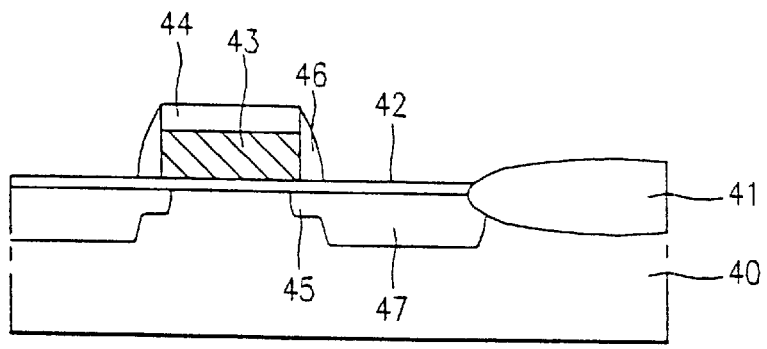
FIGS. 6a–6e are cross sections depicting the steps of a method for forming wiring in accordance with FIG. 5.

Referring to FIG. 6a, an insulating structure such as a pad oxide film and a nitride film (not shown) are deposited in succession on the P-type silicon substrate 40, and a photoresist film is coated on the nitride film and subjected to exposure and development to selectively pattern the same. Using the patterned photoresist film as a mask, the nitride film and the oxide film are removed in succession (again, not shown in the drawing). A field oxide film 41 is formed, e.g., by heat treatment, and then the photoresist film is removed. An oxide film is formed on the exposed surface of the substrate 40, e.g., by thermal oxidation or chemical vapor deposition. Then, the doped polysilicon layer,. e.g., N-type, is formed on the exposed surfaces and so is an insulator, e.g., a silicon oxide film formed by chemical vapor deposition. Alternatively, instead of the doped polysilicon layer, a doped amorphous silicon layer may be used.

Continuing the discussion of FIG. 6a, a photoresist film is coated on the entire surface and subjected to exposure and development to selectively pattern the photoresist film. Using the patterned photoresist film as a mask, the silicon oxide film and the polysilicon layer are selectively removed, e.g., by anisotropic etching, in succession to form the gate electrode 43 and a gate cap oxide film 44. N-type ions, phosphorus ions, are injected into the P-type semiconductor substrate 40 on both sides of the gate electrode 42 at a dosage of about $2.3 \times 10^{13}$ atoms/cm$^2$ and an ion implantation energy of about 30 KeV to form lightly doped source/drain regions 45. Alternatively, if the substrate is of N-type conductivity, P-type ions, e.g., boron ions, are injected. An insulator, e.g., a silicon oxide film, is formed on the entire surface, e.g., by thermal oxidation or chemical vapor deposition, and selectively removed, e.g., by reactive anisotropic ion etching of the same so as to form the sidewall spacers 46 against both sides of the gate electrode 43 and the gate cap oxide film 44. N-type ions, e.g., arsenic, are injected into the P-type semiconductor substrate 40 on both sides of the sidewall spacers 46, at a dosage of about $6.0 \times 10^{15}$ atoms/cm$^2$ and an ion implantation of about 50 KeV, to form heavily doped source/drain regions 47 therein.

Figure 6B:
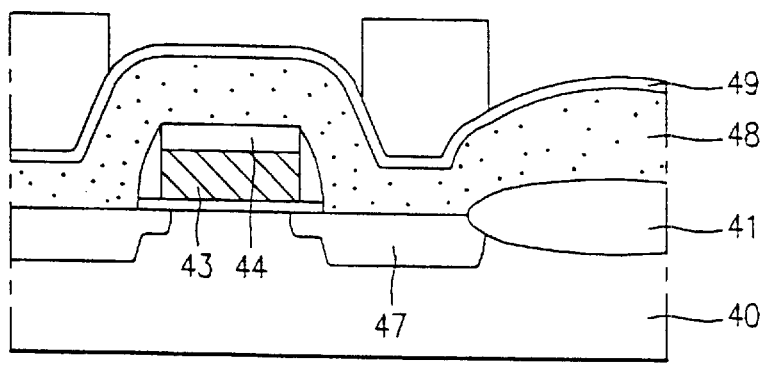

Referring to FIG. 6b, a conductive layer 48, e.g., a doped semiconductor such as phosphorus-doped or arsenic-doped polysilicon or amorphous silicon, is formed on the entire surface and an insulator, e.g., a silicon nitride film, 49 is formed thereon by, e.g., LPCVD, respectively. Alternatively, if the semiconductor substrate is of N-type, then P-type, e.g., boron, doped polysilicon or amorphous silicon layer 48 is used. A photoresist film is coated on the entire surface and subjected to photolithography and development to selectively pattern the same.

Figure 6C:
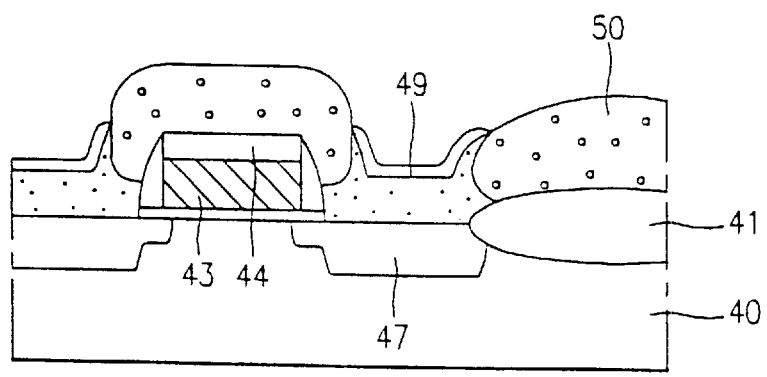

Referring to FIG. 6c, using the patterned photoresist film as a mask, the exposed silicon nitride film 49 is removed, e.g., by anisotropic reactive ion etching. After removing the remaining photoresist film, the exposed polysilicon layer 48 is subjected, e.g., to an elevated temperature of about 800° C. in an electric diffusion furnace having an $H_2/O_2$ mixed gas environment to oxidize the polysilicon layer 48 into a polysilicon oxide film 50.

Figure 6D:
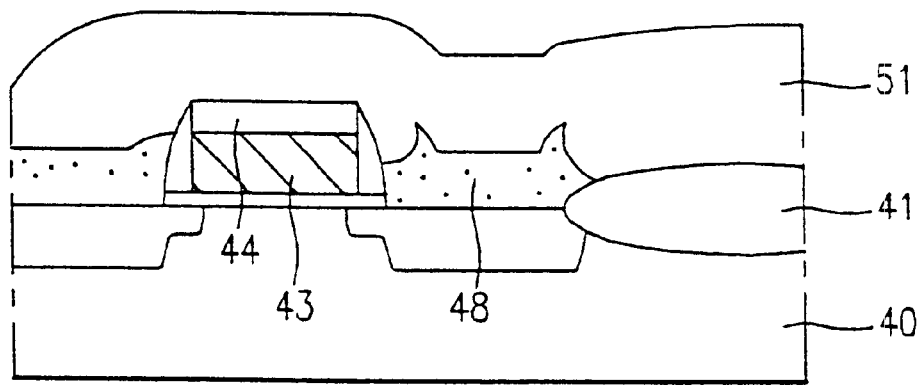

Referring to FIG. 6d, the oxidized polysilicon oxide film 50 is completely removed, e.g., by dipping it into fluoric acid. The silicon nitride film is removed, e.g., by dipping it into hot phosphorus acid to remove the same. Then an insulating layer, e.g., a chemical vapor deposition oxide film, 51 is formed on the entire surface.

Figure 6E:
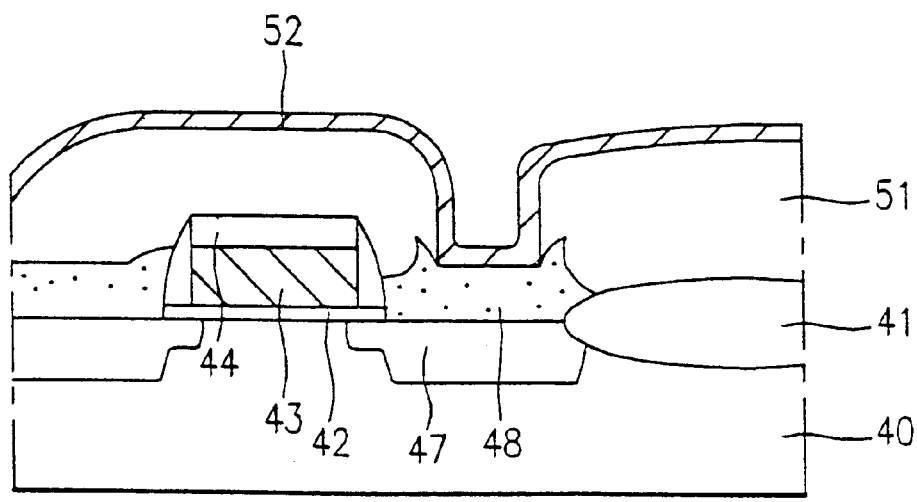

Referring to FIG. 6e, the a photoresist film is coated on the entire surface and subjected to photolithography exposure and development to selectively pattern the photoresist film. Using the patterned photoresist film as a mask, the exposed chemical vapor deposition oxide film 51 is selectively removed, e.g., by reactive ion etching. This forms a contact hole in the polysilicon layer 4 on the source/drain region on one side of the gate electrode 43. Then, after removing the photoresist film, a conductive layer, e.g., a metal such as aluminum, is formed on entire surface in contact with the polysilicon layer 48.

As an alternative in the second embodiment, if the polysilicon oxide film 50 is not removed, the chemical vapor deposition oxide film 51 may be deposited thereon. As a further alternative, the object of the present invention can be achieved even if the silicon nitride film 49 on the polysilicon layer 49 located over the source/drain regions on both sides of the gate electrode 43 is not removed. Thus, when the contact hole is formed through the CVD oxide film 51 without removing the silicon nitride film 49, there is the advantage that no etching damage to the polysilicon layer 48 located under the silicon nitride film 49 occurs because it acts an etch stopping layer.

Figure 7A:
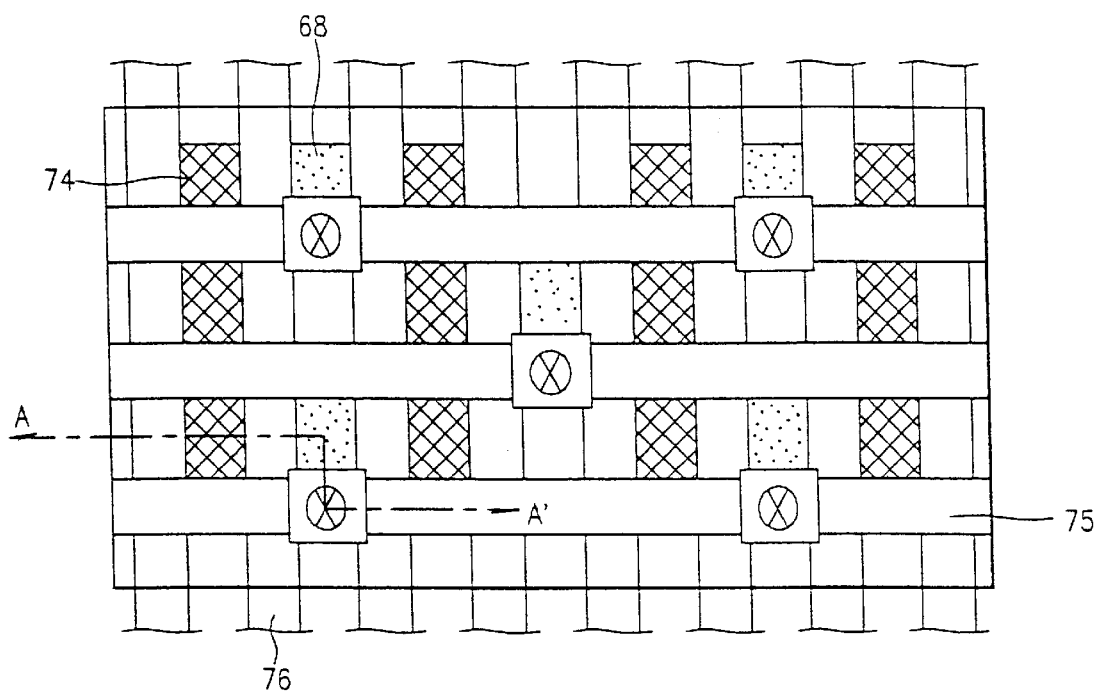
FIG. 7a is a layout diagram of wiring for a semiconductor device in accordance with a third embodiment of the present invention.

FIG. 7a is a layout diagram of wiring for a semiconductor device in accordance with a third embodiment of the present invention.

The wiring of the third embodiment shown in FIG. 7a is an example of wiring of the present invention applied to a 256M or greater class of DRAM, in which bit lines 75 are arranged parallel to each other at a right angle to word lines 76 such that they will not cross or overlap with "I" formed active regions 74. Contact wiring between the "I" formed active region 74 and the bit line 75 is formed over the field oxide films. The contact wiring is in contact with the polysilicon layers 68 that are in contact with source/drain regions and with parts of the field oxide films.

Figure 7B:
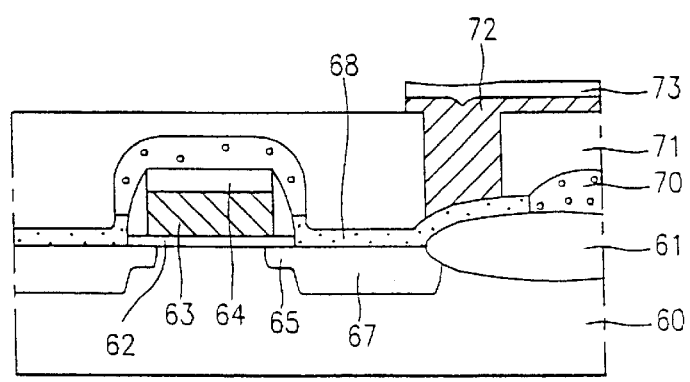
FIG. 7b is a cross section taken along (across) line A–A' of FIG. 7a depicting wiring for a semiconductor device in accordance with the third embodiment of the present invention.

FIG. 7b is a cross section, taken along line A–A' in FIG. 7a, illustrating wiring for a semiconductor device in accordance with a third embodiment of the present invention.

Referring to FIG. 7b, the third embodiment wiring includes: a field oxide film 61 formed in a predetermined region of a doped semiconductor substrate 60, e.g., P-type silicon; a gate insulator, e.g., oxide, film 62 and a gate electrode 63 formed in succession on a predetermined portion in an active region insulated by the field oxide film 61; a gate cap oxide film 64 formed on the gate electrode 63; source/drain regions 65 of LDD structure, e.g., of N-type conductivity, formed in the P-type semiconductor substrate 60 on both sides of the gate electrode 63; heavily doped, e.g., N-type, source/drain regions formed in the substrate 60 on both sides on both sides of the spacers; a first conductive, e.g., doped polysilicon, layer 68 formed on the source/drain region on one side of the gate electrode 63 so that it extends onto the field oxide film 61 and onto the source/drain region on the other side of the gate electrode 63; an insulator, e.g., a polysilicon oxide film, 70 formed on the gate structure and on the field oxide film not having a portion of the polysilicon layer 68 thereon; an insulator, e.g., a chemical vapor deposition oxide film, 71 formed on the upper surface except over the portion of the field oxide film 61 where the first polysilicon layer 68 is exposed by a contact hole; a second conductive, e.g., doped polysilicon, layer 72 formed in contact with the first polysilicon layer 68 at the contact hole in the CVD oxide film 71; and a contact metallization layer 73, e.g., a silicide such as tungsten silicide, formed on the second polysilicon layer 72.

FIGS. 8a–8f are cross sections illustrating the steps of a method for forming wiring in accordance with a third embodiment of the present invention.

Figure 8A:
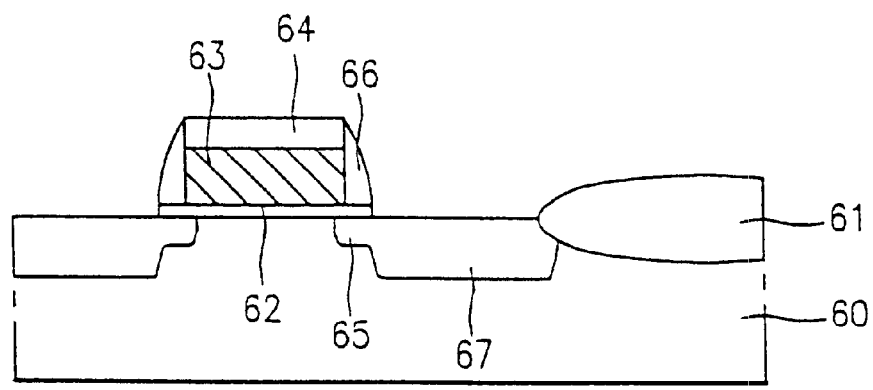
FIGS. 8a–8f are cross sections depicting steps of a method for forming wiring in accordance with FIG. 7b.

Referring to FIG. 8a, in order to form a pattern for forming an "I" formed active region 74 on the P-type silicon substrate 60, insulators such as a pad oxide film (not shown) and a nitride film (not shown) are formed on the semiconductor substrate 60 in succession and a photoresist film (not shown) is coated thereon and subjected to exposure and development to selectively pattern the photoresist film. Using the patterned photoresist film as a mask, the nitride film and the oxide film are removed in succession (again not shown in the drawing). A field oxide film 61 is then formed, e.g., by thermal oxidation, and the photoresist film is removed. An insulator, e.g., an oxide film, is formed on entire surface, e.g., by thermal oxidation in an $H_2/O_2$ mixed gas environment of an electric furnace, as the basis for forming a gate oxide film 62.

Continuing the discussion of FIG. 8a, a conductive layer, e.g., doped polysilicon, is formed on the exposed surfaces by LPCVD and an insulator, e.g., silicon oxide film, is formed thereon, e.g., by CVD. Alternatively, a doped amorphous silicon layer may be used in place of the doped polysilicon layer. A photoresist film (not shown) is coated on entire surface and subjected to exposure and development to selectively pattern the photoresist film. Using the patterned photoresist film as a mask, the silicon oxide film and the polysilicon layer are subjected to anisotropic etching, to form a gate electrode 63 and a gate cap oxide film 64. N-type conductivity dopants, e.g., phosphorus ions, are injected into the P-type semiconductor substrate 60 on both sides of the gate electrode 63 at a dosage of about $2.3 \times 10^{13}$ atoms/cm$^2$ and an ion implantation energy of about 50 KeV to form lightly doped source/drain regions 65. Alternatively, if the semiconductor substrate is of N-type conductivity, then P-type conductivity dopants, e.g., boron ions, are injected.

After this first ion implantation, an insulator, e.g., a silicon oxide, film is formed on the entire surface, e.g., by thermal oxidation or chemical vapor deposition, and is subjected to reactive ion etching to anisotropically etch the silicon oxide so as to form sidewall spacers 66 against both sides of the gate electrode 63 and the gate cap oxide film 64. N-type dopants, e.g., arsenic ions (As$^+$), are injected into the P-type semiconductor substrate 70 on both sides of the sidewall spacers 66 at a dosage of about $6.0 \times 10^{15}$ atoms/cm$^2$ and an ion implantation energy of about 50 KeV to form heavily doped source/drain regions 67.

Figure 8B:
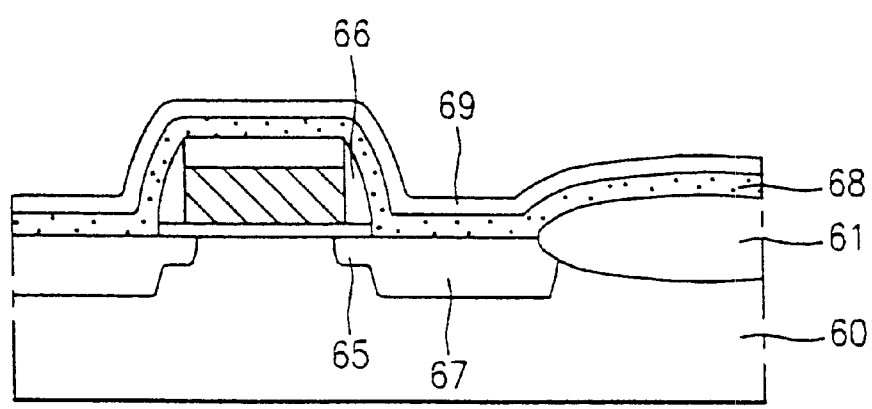

Referring to FIG. 8b, the first polysilicon layer 68 and a silicon nitride film 69 are formed on the entire surface in succession, e.g., by chemical vapor deposition. Alternatively, an amorphous silicon layer may be used in place of the first polysilicon layer 68.

Figure 8C:
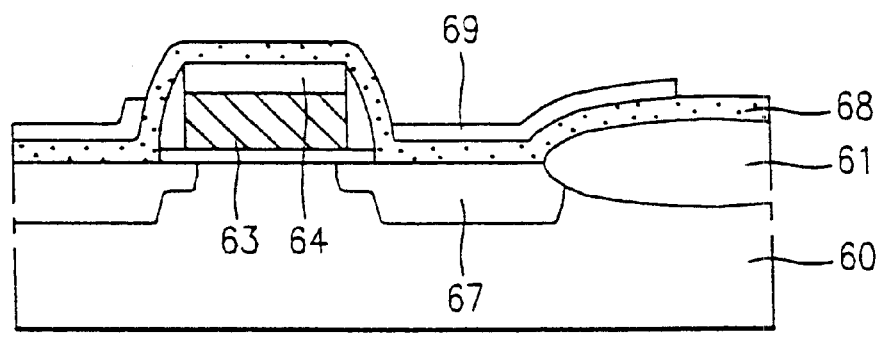

Referring to FIG. 8c, a photoresist film (not shown) is coated on the entire surface and subjected to exposure and development to selectively pattern the photoresist film, so as to leave the photoresist film on the source/drain regions in the active region and extending onto a predetermined portion of the field oxide film 61. Using the patterned photoresist film as a mask, the exposed silicon nitride film 69 is selectively removed, e.g., by reactive ion etching, until the first polysilicon layer 68 is exposed. The photoresist film is removed, thereafter.

Figure 8D:
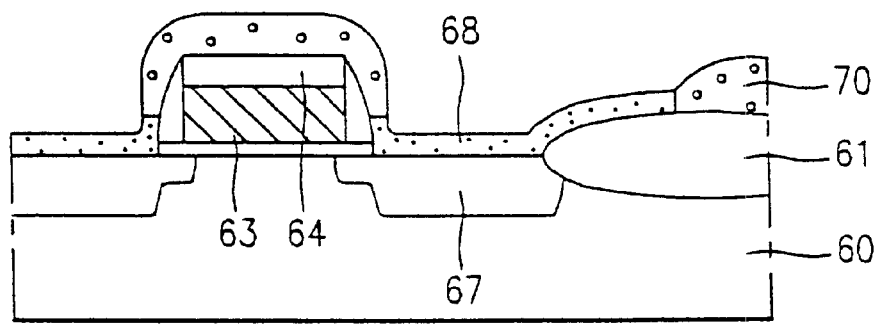

Referring to FIG. 8d, the exposed first polysilicon layer 68 is, e.g., heat treated in an $H_2O_2$ mixed gas environment to oxidize the exposed first polysilicon layer 68 into polysilicon oxide film 70. Alternatively, if the heat treatment is conducted at a high pressure, the oxidation can be done at a low temperature or in a short time. The silicon nitride film 69 is removed, e.g., by dipping it in hot phosphoric acid. Alternatively, if the first polysilicon layer 68 is not doped, ions are injected into the first polysilicon layer 68 at a dosage of about $5.0 \times 10^{15}$ atoms/cm$^2$ and at an ion implantation energy of about 30 KeV.

Figure 8E:
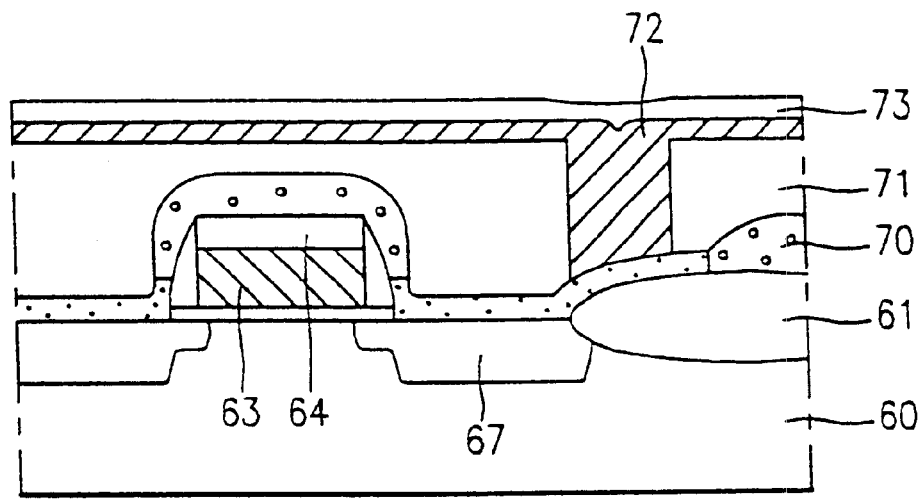
Figure 8F:
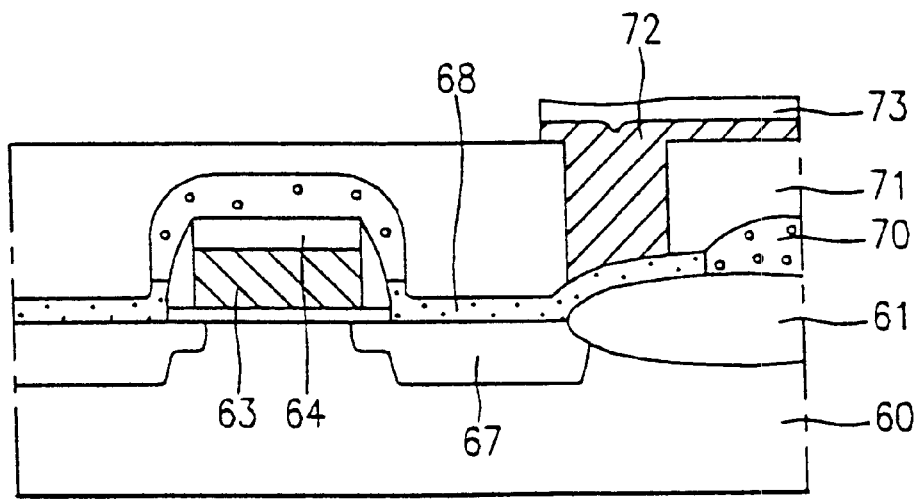

In FIG. 8e, an insulator, e.g., a chemical vapor deposition oxide film, 71 is formed on the entire surface. The insulator 71 is, e.g., TEOS or BPSG, which easily are planarized. A photoresist film (not shown) is coated on the entire surface and patterned selectively for forming a contact hole for use in electrical connection of, e.g., a bit line for a DRAM data access and a pass transistor. Using the patterned photoresist as a mask, the exposed chemical vapor deposition oxide film 71 is removed, e.g, by reactive ion etching using a plasma of $CHF_3$, or $CF_4$ gas, until the first polysilicon layer 68 is exposed. A second conductive, e.g., polysilicon, layer 72 (or alternatively an amorphous silicon layer) is formed on the entire surface, e.g., by LPCVD. A contact metallization, e.g., a silicide such as tungsten silicide (WSix), layer 73 is formed on the second polysilicon layer 72. A photoresist film (not shown) is coated on the tungsten silicide layer 73 and subjected to exposure and development to selectively pattern the photoresist film. Using the patterned photoresist film as a mask, the exposed metal silicide layer 73 and the second polysilicon layer 72 are selectively removed, e.g., by reactive ion etching in succession to form bit line wiring which completes the wiring in accordance with the third embodiment of the present invention.

As indicated above, if the substrate is doped to P-type conductivity, the source/drain regions will be doped to N-type conductivity. Similarly, if the substrate is doped to N-type conductivity, the source/drain regions will be doped to P-type conductivity.

The wiring for a semiconductor device and the method for forming the same explained above have the following advantages.

First, since a pad layer of polysilicon is formed self-aligned on the source/drain regions, the wiring process problems of step-coverage and shorts between the wiring and the semiconductor substrate, or the wiring and the gate electrode in case of misalignment, are solved, and contact resistance is also reduced.

Second, since the elevated source/drain structure (reduced by using the pad layer) achieves a transistor which has no damage to the source/drain regions in the substrate (which might otherwise occur during the process of forming a contact hole extending down to a shallow junction), performance of the semiconductor device can be improved significantly.

Third, in formation of the "I" formed DRAM cell contact, since the bit line contact hole or the capacitor node contact hole is formed over the polysilicon pad pattern (which is larger than the source/drain regions), a greater alignment tolerance for the wiring can be secured.

Various modifications and variations or would be obvious to one of ordinary skill in the art, can be made to the present inventing without departing from the spirit or scope of the invention. Thus, it is intended that the appended claims and their equivalents cover the modifications and variations of this invention.

What is claimed is:

1. A wiring structure for a semiconductor device comprising:

impurity regions formed in a substrate on both sides of an insulated gate electrode;

a first conduction layer formed on said impurity regions, said first conduction layer being in contact with a sidewall spacer of said gate electrode above a top level of said substrate, said first conduction layer not extending over any portion of said gate electrode; and a second conduction layer formed in contact with said first conduction layer on one side of said gate electrode, said second conduction layer extending over an entire top of said semiconductor device.

2. The wiring structure of claim 1, wherein said first conduction layer is one of polysilicon and amorphous silicon.

3. The wiring structure of claim 1, wherein said gate electrode is one of polysilicon and amorphous silicon.

4. The wiring structure of claim 1, wherein said substrate is doped to one of P-type and N-type conductivity, and said impurity regions are doped to one of N-type and P-type conductivity, respectively.

5. The wiring structure of claim 1, wherein said first conduction layer extends over all of said impurity regions not covered by said gate electrode and further comprising an insulating film extending over an entire top of said gate electrode and not being in contact with said impurity regions.

6. A wiring structure for a semiconductor device comprising:

impurity regions formed in a substrate on both sides of an insulated gate electrode;

a first conduction layer formed on said impurity regions on first and second sides of said gate electrode, said first conduction layer not extending over any portion of said gate electrode;

an insulating film formed on surfaces not covered by said first conduction layer such that said first conduction layer is in contact with said insulating film above a top level of said substrate; and a second conduction layer formed in contact with said first conduction layer on one side of said gate electrode, said second conduction layer extending over an entire top of said semiconductor device.

7. The wiring structure of claim 6, wherein said insulating film is one of a thermally-grown oxide of said first conduction layer and a CVD film.

8. A wiring structure for a semiconductor device as claimed in claim 6, wherein a portion of said first conduction layer formed on the impurity region on said first side of said gate electrode is isolated from a portion of said first conduction layer formed on the impurity region on said second side of said gate electrode impurity region.

9. The wiring structure of claim 6, wherein said first conduction layer is one of polysilicon and amorphous silicon.

10. The wiring structure of claim 6, wherein said gate electrode is one of polysilicon and amorphous silicon.

11. The wiring structure of claim 6, wherein said substrate is doped to one of P-type and N-type conductivity, and said impurity regions are doped to one of N-type and P-type conductivity, respectively.

12. The wiring structure of claim 6, wherein said first conduction layer extends over all of said impurity regions not covered by said gate electrode and wherein said insulating film extends over an entire top of said gate electrode and is not in contact with said impurity regions.

13. A wiring structure for a semiconductor device comprising:

impurity regions formed in a substrate on both sides of an insulated gate electrode;

a first conduction layer formed on said impurity regions, said first conduction layer being in contact with a sidewall spacer of said gate electrode above a top level of said substrate and said first conduction layer extending onto a portion of a field oxide region;

an insulating film formed on surfaces not covered by said first conduction layer; and a second conduction layer formed in contact with said first conduction layer substantially completely over said field oxide region.

14. The wiring structure of claim 13, further comprising a third conduction layer formed on said second conduction layer.

15. The wiring structure of claim 13, wherein said third conduction layer is a metal.

16. The wiring structure of claim 13, wherein said first conduction layer is one of polysilicon and amorphous silicon.

17. The wiring structure of claim 16, wherein said insulating film is one of a thermally-grown oxide of said first conduction layer and a CVD film.

18. The wiring structure of claim 13, wherein said substrate is doped to one of P-type and N-type conductivity, and said impurity regions are doped to one of N-type and P-type conductivity, respectively.

19. The wiring structure of claim 13, wherein said first conduction layer extends over all of said impurity regions not covered by said electrode and wherein said insulating film extends over a top of said gate electrode and is not in contact with said impurity regions.

* * * * *